United States Patent [19]

Davis et al.

[11] 4,393,355

[45] Jul. 12, 1983

[54] OPERATIONAL AMPLIFIER

[75] Inventors: William F. Davis, Tempe; Stuart B. Shacter, Mesa, both of Ariz.

[73] Assignee: Motorola, Inc., Schaumburg, Ill.

[21] Appl. No.: 315,085

[22] Filed: Oct. 26, 1981

[51] Int. Cl.³ .......................... H03F 3/04; H03F 1/34
[52] U.S. Cl. .................................... 330/294; 330/260; 330/311
[58] Field of Search ............... 330/147, 255, 260, 294, 330/307, 311

[56]  References Cited

U.S. PATENT DOCUMENTS 3,629,691 12/1971 Wheatley ...................... 330/307 X Primary Examiner—James B. Mullins
Attorney, Agent, or Firm—Vincent B. Ingrassia

[57] ABSTRACT

The gain and phase characteristics of an operational amplifier are improved by adding a system zero to cancel a pole and thereby broadband the amplifier. This is accomplished by simultaneously driving the base terminals of the second stage gain transistor and preceding follower transistor and biasing the circuit such that the dynamic emitter resistance of the follower transistor is much greater than that of the gain transistor and/or by adding an additional emitter impedance.

3 Claims, 7 Drawing Figures

- PRIOR ART -

4,393,355

OPERATIONAL AMPLIFIER

BACKGROUND OF THE INVENTION

1. Field of the Invention

This invention relates generally to operational amplifiers and, more particularly, to an operational amplifier second stage into which a system zero has been introduced to help cancel a system pole and thus broadband the amplifier.

2. Description of the Prior Art

In most feedback operational amplifiers currently in use, an input gain stage drives a second stage consisting of at least one emitter follower transistor (or perhaps the input transistor of an emitter follower Darlington pair) which in turn drives a second stage gain transistor. The output of the circuit is generally coupled to the collector of this gain transistor by emitter follower output transistors. A capacitor (Miller) is usually coupled between the collector of the second stage gain transistor and the base of the first emitter follower transistor (i.e. the output of the input stage).

Since negative feedback is generally employed in an operational amplifier, a DC phase shift of 180 degrees is usually inherent in the circuit from input to output. It would therefore be desirable not to add additional negative phase shift into the circuit at higher frequencies to assure that the total phase shift from input to output does not exceed 360 degrees when the open loop amplifier is exhibiting voltage gain to ensure unity gain closed loop stability. However, the typical circuit described above purposely provides a dominant pole (a 6db/octave frequency dependent amplitude decay) which results in the introduction of an additional negative phase shift of 90 degrees in the limit at high frequencies. Although the total phase shift for the amplifier at frequencies above the pole frequency is now 270 degrees, the amplifier's open loop gain is reduced by 6db/octave as a result of the dominant pole. Thus, the pole is strategically placed to assure that at high frequencies, the amplifier voltage gain is reduced to less than one before an additional 90 degrees of excess negative phase shift is accumulated due to other parasitic poles within the amplifier (bringing the total negative phase shift to 360 degrees.) It should be clear that if the first parasitic pole is either cancelled or removed, the dominant pole can be placed higher in frequency to achieve a higher amplifier unity gain stable bandwidth.

SUMMARY OF THE INVENTION

It is an object of the present invention to provide an improved operational amplifier.

It is a further object of the present invention to provide an operational amplifier employing second stage Miller frequency compensation wherein the drive from the input stage is applied not only to the input base of the initial second stage emitter follower current gain transistor, but also simultaneously to subsequent second stage input transistor bases.

It is a still further object of the present invention to provide an operational amplifier wherein an additional zero (a 6db/octave frequency dependent amplitude increase with positive phase approaching 90 degrees) is introduced to assist in cancelling the effects of a parasitic pole and therefore increase the unity gain frequency bandwidth due to the improved phase characteristics over a given frequency range.

According to a broad aspect of the invention there is provided an operational amplifier having an output stage, said operational amplifier comprising: an input stage for generating a drive signal; first means coupled to said input stage and responsive to said drive signal for generating first and second currents; follower transistor means coupled to said first means having an input driven by said first current; a gain transistor coupled to said follower transistor means and responsive to said first and second currents; and a capacitor having a first terminal coupled to said first means and a second terminal coupled to the output of said gain transistor.

The above and other objects, features and advantages of the present invention will be more clearly understood from the following detailed description taken in conjunction with the accompanying drawings, in which:

DESCRIPTION OF THE PREFERRED EMBODIMENT

Figure 1:
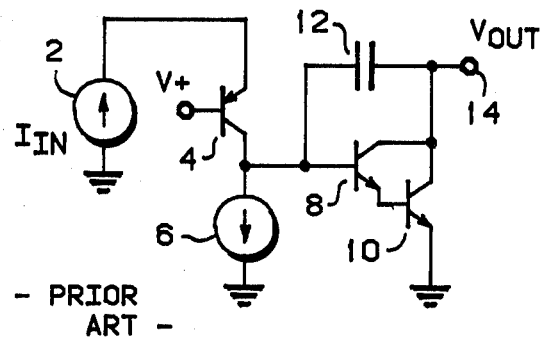
FIGS. 1 and 2 are schematic diagrams of operational amplifier in accordance with the prior art.

FIG. 1 illustrates the basic elements of an operational amplifier in accordance with the prior art. An input stage (differential or single ended) is represented by current source 2 which supplies signal current to a PNP drive transistor 4. As can be seen, current source 2 is shown as being connected between ground and the emitter of transistor 4 whose base electrode is also coupled to a low impedance voltage source V+. The collector of transistor 4 is coupled to ground via current source 6 and to the base of NPN transistor 8. The emitter of transistor 8 is coupled to the base of transistor 10, and the collector of transistor 8 is coupled to the collector of transistor 10. The collector of transistor 8 could also be coupled to the positive supply. The emitter of transistor 10 is coupled to a negative potential or ground. A Miller capacitor 12 is coupled across the base of transistor 8 and the collector of transistor 10. The voltage output of the circuit ($V_{OUT}$) appears at terminal 14. While current source 2 corresponds to an operational amplifier input gain stage, transistors 8 and 10 correspond to the second gain stage of the amplifier.

Figure 2:
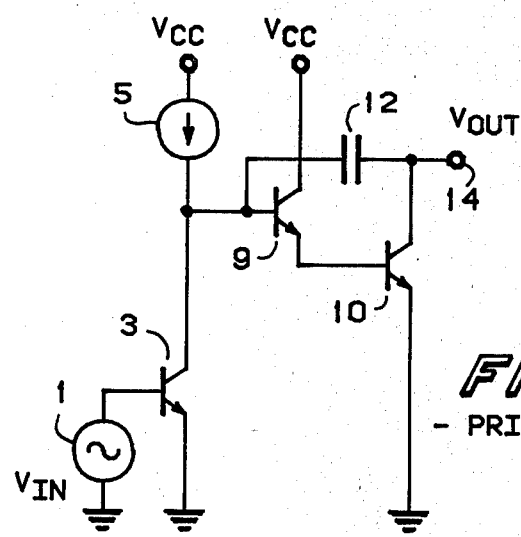

FIG. 2 is a schematic diagram of a second operational amplifier in accordance with the prior art. In this case, the input stage is represented by a transistor 3 having a base terminal adapted to be coupled to an input voltage $V_{IN}$. The emitter of transistor 3 is coupled to a negative voltage or ground while the collector of transistor 3 is coupled to one terminal of a current source 5 the other terminal of which is coupled to a positive supply voltage $V_{CC}$. A first transistor 9 has its base coupled to the collector of transistor 3, a collector coupled to $V_{CC}$ and an emitter coupled to the base of a second transistor 10. Transistor 10 has an emitter coupled to a negative supply voltage or ground and a collector coupled to the output terminal 14 at which the output $V_{OUT}$ appears. The Miller capacitor 12 is coupled between output terminal 14 and the base of transistor 9.

The prior art arrangements shown in FIGS. 1 and 2 produce a dominant system pole near zero frequency. Furthermore, a single zero exists at $1/r_{e10}C$ where $r_{e10}$ is the dynamic emitter impedance of transistor 10 and C is the capacitance of Miller capacitor 12. This zero provides 6db/octave amplitude increase with frequency but unfortunately produces 90 degrees of excess negative phase which is detrimental since it increases the gain of the circuit with frequency and increases the negative phase introduced into the circuit. Usually, however, since the second stage current is large (re10 is small), this zero is usually far removed from the bandwidth of the amplifier and thus the amplifier is unaffected.

Figure 3:
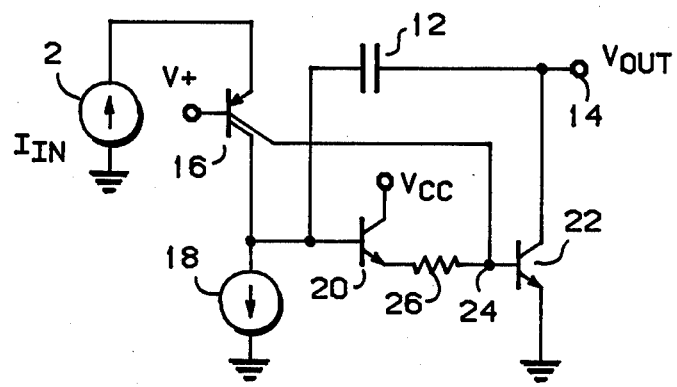
FIG. 3 is a schematic diagram of a first operational amplifier embodying the teachings of the present invention.

FIG. 3 is a schematic diagram of an operational amplifier's input and second stages in accordance with the present invention. Like elements are denoted with like reference numerals. The current being supplied by current source 2 which represents the operational amplifier's input gain stage is equivalent to $g_m V_{in}$ where $g_m$ is the transconductance of the input stage. The current being supplied by current source 2 is applied to the emitter terminal of a dual collector PNP transistor 16 having a base which is coupled to a low impedance voltage source V+. A first collector is coupled to ground via current source 18 and to the base terminal of NPN follower transistor 20. Follower transistor 20 has a collector adapted to be coupled to a source of supply voltage $V_{CC}$ (or to the collector of transistor 22) and an emitter coupled to an impedance means 26 which is in turn coupled to the base of NPN voltage gain transistor 22. The second collector of transistor 16 is coupled to the base of voltage gain transistor 22. As was the case in the prior art circuit, the emitter of transistor 22 is coupled to a negative potential or ground, the collector of transistor 22 is coupled to output terminal 14 at which an output voltage $V_{OUT}$ appears and a Miller capacitor is coupled between a base of transistor 20 and the collector of transistor 22.

As can be seen, instead of merely driving the second stage base of a single input emitter follower transistor (transistor 8 in FIG. 1), base drive is simultaneously applied to transistors 20 and 22 by means of the first and second collector terminals of transistors 16.

Figure 5:
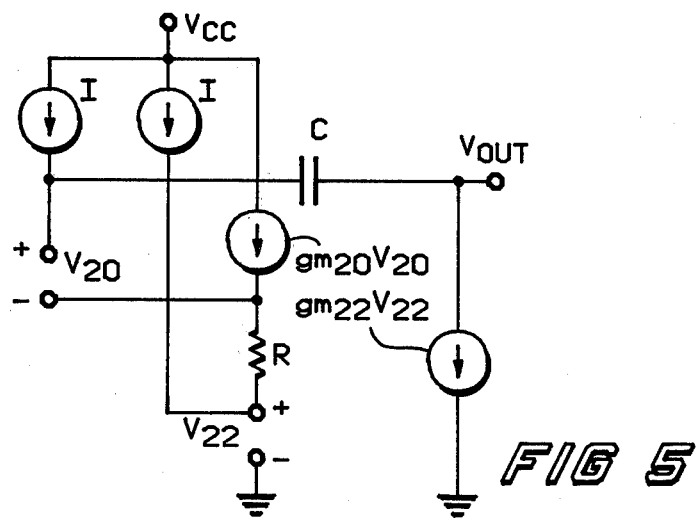
FIG. 5 is equivalent to the circuit shown in FIG. 3.

FIG. 5 is equivalent to the circuit shown in FIG. 3 and serves as the basis for the following analysis. The sub-scripts in FIG. 5 correspond to the element reference numbers shown in FIG. 3. Referring to FIG. 3, assume that current source $I_{in}$ is supplying a signal current $2I$ and that a current $I$ flows in each collector of transistor 16. Then using the simple equivalent circuit of FIG. 5, it can be seen that $$I = g_{m22} V_{22} \text{ or } V_{22} = I/g_{m22} \quad (1)$$

and $$I = -g_{m20} V_{20} \text{ or } V_{20} = -I/g_{m20} \quad (2)$$

Further, $$I = (V_{20} + g_{m20} V_{20} R + V_{22} - V_{OUT}) SC \quad (3)$$

Substituting equations (1) and (2) into equation (3) yields:

$$-SC \, V_{OUT} = I\left(1 - SC\left(\frac{1}{g_{m22}} - \frac{1}{g_{m20}} - R\right)\right)$$

Since $$g_m = 1/r_e$$

then $$\frac{V_0}{I} = \frac{-(1 - SC(r_{e22} - r_{e20} - R))}{SC}$$

where $r_{e20}$ is the dynamic emitter impedance of transistor 20, R is the resistance of impedance means 26, $r_{e22}$ is the dynamic emitter impedance of transistor 22 and S stands for a LaPlace transform. Thus, a zero exists at $S = 1/C(r_{e22} - r_{e20} - R)$. By making $(R + r_{e20})$ much greater than $r_{e22}$, it is possible to provide a zero in the transfer function which will cancel a parasitic pole and broadband the amplifier. For example, if 10 microamps flows through transistor 20 and 100 microamps flows through transistor 22, and R equals 200 ohms, $r_{e20} + R$ will equal approximately (2000+2600) ohms and with capacitor C equal to 10 picofarads, a system zero is produced at approximately 3.5 MHz. In addition, the zero which provided the negative phase has been removed. As a result, the overall phase and gain characteristics of the circuit have been substantially improved since this zero can be used to cancel some other system pole.

Figure 4:
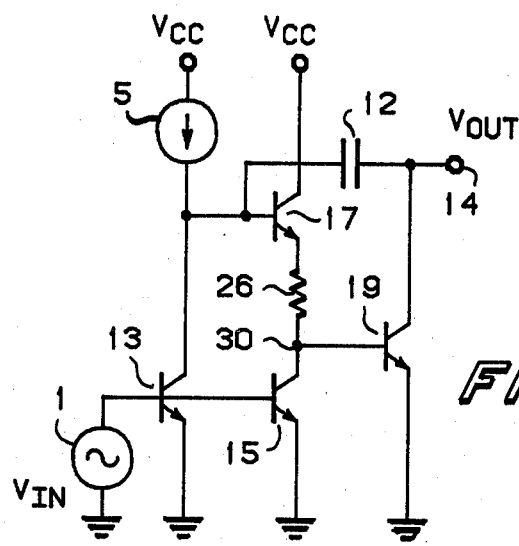
FIG. 4 is a schematic diagram of a second operational amplifier embodying the teachings of the present invention.

FIG. 4 is a schematic diagram of a second embodiment in accordance with the present invention. Like elements have been denoted with like reference numerals. In this case, input stage 2 is coupled to the base terminals of transistors 13 and 15 each having emitters coupled to a negative supply or ground. Thus, equal voltages appear at the base terminals of transistors 13 and 15. The collector of transistor 13 is coupled via current source 5 to a source of supply $V_{CC}$ and is also coupled to the base of transistor 17. The collector of transistor 17 is coupled to $V_{CC}$, and the emitter of transistor 17 is coupled to a resistor 26 which is in turn coupled to the base of transistor 19 and to the collector of transistor 15. The emitter of transistor 19 is coupled to ground or negative supply and its collector is coupled to an output terminal 14 at which an output voltage $V_{OUT}$ appears. The Miller capacitor 12 is coupled between output terminal 14 and the base of transistor 17.

Referring to the prior art circuit shown in FIG. 2, when transistor 3 is turned on, base drive is diverted away from transistor 9. On the other hand, when transistor 3 is off, current being supplied by current source 5 is applied to the base of transistor 9 turning on which in turn turns transistor 10 on causing the output voltage $V_{OUT}$ to go low.

In the inventive circuit shown in FIG. 4, an increasing voltage appearing at the bases of transistors 13 and 15 will render them more conductive causing base drive to be diverted from transistors 16 and 19 maintaining them in a less conductive state. However, when transistors 13 and 15 are less conductive, more base drive is supplied to transistor 17 rendering it more conductive which in turn supplies base drive to transistor 19. This causes transistor 19 to become more conductive causing the output voltage $V_{OUT}$ to go low. Here, instead of merely diverting current from the base of a single input transistor, base drive is simultaneously diverted from transistors 13 and 15. Again, a zero is provided in the transfer function at a location $S=-1/(r_{e17}+R-r_{e19})$ which cancels a parasitic pole and broadbands the amplifier.

Figure 6A:
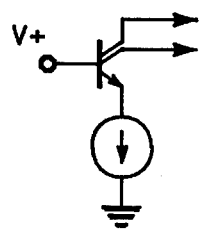
FIGS. 6A and 6B are a schematic diagrams of alternate means of driving the second stage of the circuit shown in FIG. 3.
Figure 6B:
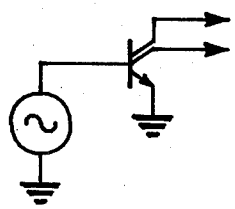

FIGS. 6A and 6B merely indicate alternate methods of driving transistors 20 and 22. The first and second collectors are used to simultaneously drive the bases of transistors 20 and 22.

The above description is given by way of example only. Changes in form and details may be made by one skilled in the art without departing from the scope of the invention. For example, impedance means 26 may be a resistor or a diode having a cathode coupled to the emitter of transistor 20 and an anode coupled to the base of transistor 22. Furthermore, it should be obvious to one skilled in the art that an additional follower transistor may be placed between node 24 and the base of transistor 22 (FIG. 3) and/or node 30 and transistor 19 (FIG. 4).

We claim:

1. An operational amplifier having an output stage, said operational amplifier comprising:
    an input stage for generating a drive signal;
    first means coupled to said input stage and responsive to said drive signal for generating first and second currents, said first means comprising a transistor having first and second collectors;
    follower transistor means coupled to said first means and having an input driven by said first current, said follower transistor means having emitter and collector terminals, and having a base terminal coupled to said first collector;
    a gain transistor coupled to said follower transistor means and responsive to said first and second currents, said gain transistor having base, emitter and collector terminals, said base terminal coupled to the emitter of said follower transistor and to said second collector, said emitter terminal adapted to be coupled to ground and said collector terminal coupled to the input of said output stage; and
    a capacitor having a first terminal coupled to said first collector and a second terminal coupled to the collector of said gain transistor.

2. An operational amplifier according to claim 1 wherein said first means is a PNP transistor having a base adapted to be coupled to ground and an emitter coupled to said input stage.

3. An operational amplifier according to claim 1 wherein said first means is an NPN transistor having a base adapted to be coupled to a supply voltage and an emitter coupled to said input stage.

* * * * *